(12) United States Patent
Sadd et al.

(10) Patent No.: US 9,741,417 B1
(45) Date of Patent: Aug. 22, 2017

(54) SENSE AMPLIFIER CIRCUIT

(71) Applicant: FREESCALE SEMICONDUCTOR, INC., Austin, TX (US)

(72) Inventors: Michael A. Sadd, Austin, TX (US); Jon Scott Choy, Austin, TX (US); Michael Garrett Neaves, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/293,335

(22) Filed: Oct. 14, 2016

(51) Int. Cl.
 *G11C 11/00* (2006.01)
 *G11C 11/16* (2006.01)
 *G11C 7/06* (2006.01)

(52) U.S. Cl.
 CPC ............ *G11C 11/1673* (2013.01); *G11C 7/06* (2013.01); *G11C 7/062* (2013.01); *G11C 11/16* (2013.01); *G11C 11/1697* (2013.01)

(58) Field of Classification Search
 CPC ... G11C 11/1673; G11C 11/1697; G11C 7/06; G11C 7/062; G11C 11/16; H03F 2203/45034; H03F 2203/45244
 See application file for complete search history.

(56) References Cited

U.S. PATENT DOCUMENTS

| | | | |
|---|---|---|---|
| 4,857,725 A | 8/1989 | Goodnough et al. | |
| 6,990,030 B2 | 1/2006 | Lemus et al. | |
| 8,693,273 B2 | 4/2014 | Yuh et al. | |
| 8,837,210 B2 | 9/2014 | Jefremow et al. | |
| 9,070,466 B2 | 6/2015 | Jefremow et al. | |
| 9,076,540 B2 | 7/2015 | Mueller et al. | |
| 9,224,464 B2 | 12/2015 | Chou et al. | |
| 9,343,131 B1 * | 5/2016 | DeBrosse | G11C 11/1673 |
| 9,378,781 B1 | 6/2016 | Jung et al. | |
| 9,384,792 B2 | 7/2016 | Bonaccio et al. | |
| 2014/0063923 A1 | 3/2014 | Jefremow et al. | |
| 2014/0369132 A1 * | 12/2014 | Cernea | G11C 16/28 365/185.21 |
| 2015/0063048 A1 | 3/2015 | Lin et al. | |
| 2015/0228322 A1 * | 8/2015 | Jung | G11C 11/1673 365/158 |

OTHER PUBLICATIONS

Non-final office action dated Feb. 2, 2017 in U.S. Appl. No. 15/281,400.

(Continued)

*Primary Examiner* — Toan Le
(74) *Attorney, Agent, or Firm* — David G. Dolezal

(57) ABSTRACT

In one embodiment, a sense amplifier circuit includes two current paths. Each path includes a transistor configured as a current source during a memory read operation and a second transistor. During the first phase of a memory read operation, the first current path is coupled to one cell and the second current path is coupled to a second cell. The sense amplifier circuit includes a capacitor that during a first phase of a memory read operation, is coupled between two corresponding nodes of the two paths to store a voltage difference between the two nodes. During the second phase, the cell/current path couplings are swapped and the capacitor is coupled to the control terminal of one of the second transistors to control the conductivity of the transistor for adjusting a voltage of an output node to indicate the value of the data being read.

23 Claims, 6 Drawing Sheets

(56) References Cited

OTHER PUBLICATIONS

U.S. Appl. No. 14/924,269, filed Oct. 27, 2015; entitled "Sense Path Circuitry Suitable for Magnetic Tunnel Junction Memories".
Andre, T., "ST-MRAM Fundamentals, Challenges, and Applications", 2013 Custom Integrated Circuits Conference, 2013 IEEE.
U.S. Appl. No. 15/281,400, filed Sep. 30, 2016; entitled "Sense Amplifier Circuit".

* cited by examiner

SENSE AMPLIFIER CIRCUIT

BACKGROUND OF THE INVENTION

Field of the Invention

This invention relates in general to a memory circuit and more specifically a sense amplifier circuit for a memory circuit.

Description of the Related Art

Some memory circuits utilize sense amplifier circuits for reading the storage states of memory cells of a memory circuit. Some sense amplifier circuits include a reference path that includes a reference cell and a sense path that is coupled to the cell being read during a read operation. In some examples, a current of the reference path is mirrored and compared to a current of the sense path for determining the storage state of the memory cell being read.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In one embodiment, a sense amplifier circuit includes two current paths. Each path includes a transistor configured as a current source during a memory read operation and a second transistor. During a first phase of a memory read operation, the first current path is coupled to one cell and the second current path is coupled to a second cell. The sense amplifier circuit includes a capacitor that during a first phase of a memory read operation, is coupled between two corresponding nodes of the two paths to store a voltage difference between the two nodes. During a second phase of a memory read operation, the cell/current path couplings are swapped and the capacitor is coupled to the control terminal of one of the second transistors to control the conductivity of the transistor for adjusting a voltage of an output node to indicate the value of the data being read. The current sources act to limit the current through the current paths to reduce the current of the memory read operation. The voltage of the capacitor stored in the first phase may act to more quickly change the voltage of the output node to indicate the value being read. Also, the voltage of the capacitor stored in the first phase may act to compensate for device matches between the paths. Accordingly, in some embodiments, the sense amplifier provides for better read margins at lower power.

With some types of memory cells such as resistive memory cells (e.g. MRAM), the resistance margin between a memory cell being read and a reference cell may be less than 1K ohm. Furthermore, with some embodiments, to avoid disturbing the memory cell during a memory read operation, the current should be limited e.g. in the range of 10-20 micro amps. Translating this current to the difference in voltage drops across the resistive memory cell and reference cell means that in some embodiments, a sense amplifier circuit must distinguish differences in the voltages of less than 10-20 mV, which can be in the range of device mismatch of some transistors of the sense amplifier circuit.

Figure 1:
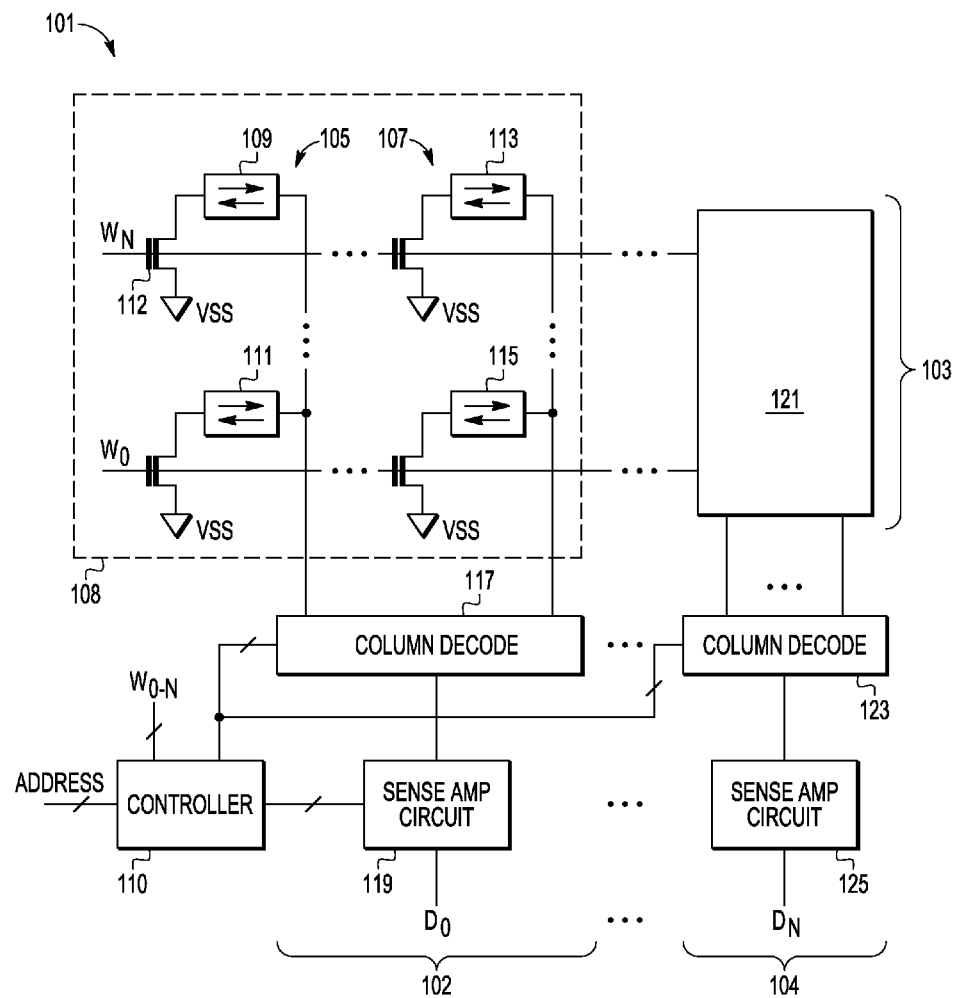
FIG. 1 is a circuit diagram of a memory circuit according to one embodiment of the present invention.

FIG. 1 is a circuit diagram of a memory circuit according to one embodiment of the present invention. Memory circuit 101 includes a memory array 103. In the embodiment shown, memory array 103 includes resistive memory cells (e.g. 109, 113, 111, and 115) located in rows and columns. In the embodiment shown, memory array 103 includes two array segments, segment 108 and segment 121. The memory cells of segment 121 are not shown in FIG. 1. Each segment includes a number of cells that are individually accessible by asserting a specific word line (W0 . . . WN) and by selecting the appropriate column (105, 107) by column decode circuitry 117 and 123. The word lines are each connected to access transistors (112) of a cell of a column that are made conductive when the word line is asserted.

A cell of array segment 108 can be read by sense amplifier circuit 119 and a cell of array segment 121 (cells not specifically shown) can be read by sense amplifier circuit 125. Sense amplifier circuits 119 and 125 each produce a data bit (D0, DN, respectively) that is indicative of the storage state of the memory cell of the memory segment being read during a read operation. The specific cell of the segment being read is determined by an address provided to controller 110. Controller 110 asserts the appropriate word line and selects the appropriate columns via the column decode circuitry (117, 123) to couple the cells being read to the sense amplifier circuits (119, 125).

In some embodiments, the memory cells (109, 113, 111, and 115) of array 103 are resistive memory cells. In one embodiment, the cells are MRAM cells, but may be of other types of resistive memory cells in other embodiments such as ReRAM cells, carbon nanotube cells, phase change cells, cross point, or programmable metallization cells. A resistive memory cell is a memory cell capable of having different resistive values with each resistive value indicative of a storage state of the memory cell. In other embodiments, array 103 may include other types of memory cells. In one embodiment, the memory cells have two storage states. With one storage state, the memory cell has a high resistive value, and with the other storage state, the memory cell has a low resistive value. In one embodiment, the memory cells of array 103 are non-volatile in that they retain their memory state without being powered by a power source. In other embodiments, array 103 may store data values in complementary memory cells.

Although the memory circuit in FIG. 1 shows two rows, two array segments (108, 121), two columns per array segment, and two sense amplifier circuits (119 and 125), other memory circuits may include a different number of rows, array segments, columns per array circuit, and/or sense amplifier circuits. Also, in other embodiments, memory circuit 101 may have other configurations and/or include other circuitry in other embodiments. Memory circuit 101 may be implemented in a standalone integrated circuit or may be integrated with other circuitry (e.g. a processor, peripherals, not shown) in an integrated circuit.

Figure 2:
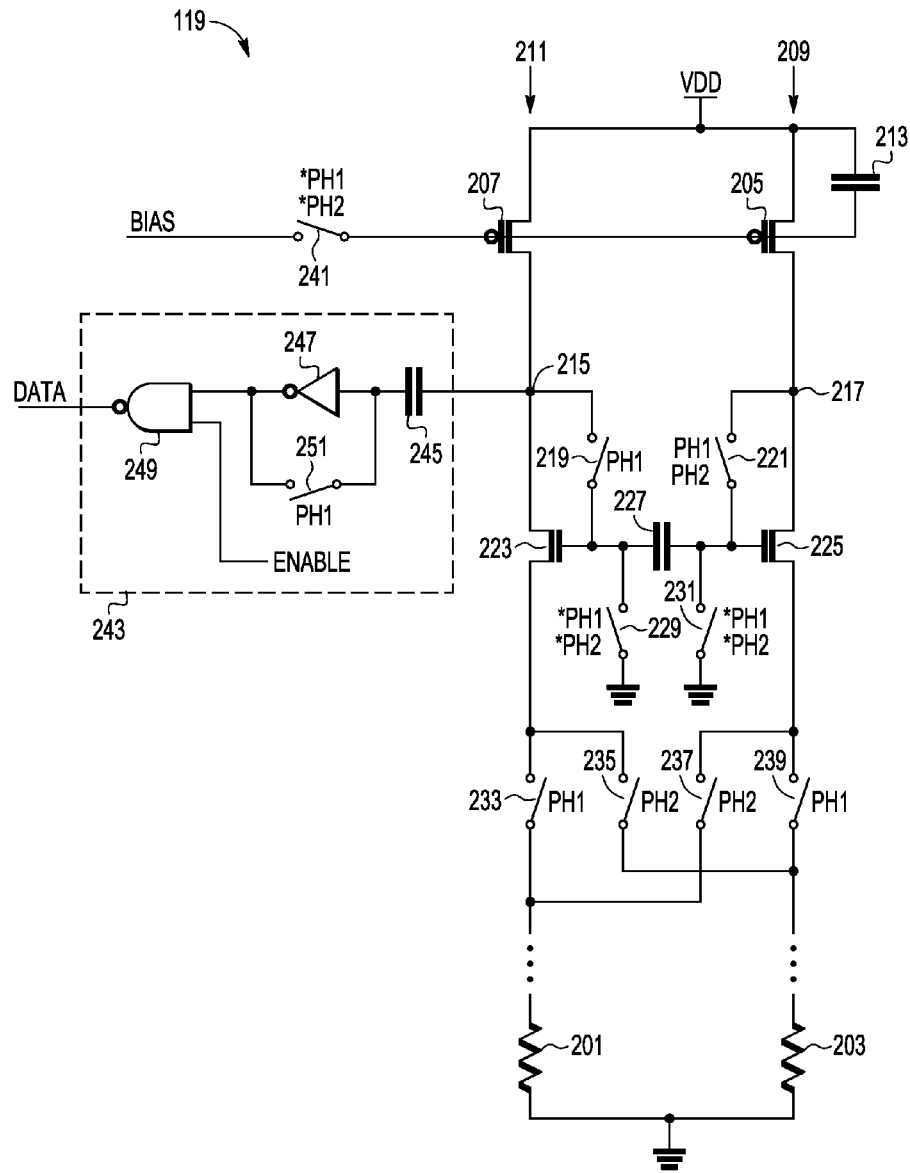
FIG. 2 is a circuit diagram of a sense amplifier circuit according to one embodiment of the present invention

FIG. 2 is a circuit diagram of one embodiment of a sense amplifier circuits (e.g. sense amplifier circuit 119) of memory circuit 101. In one embodiment, cell 203 represents a memory cell in segment 108 that is read during a memory read operation by sense amplifier circuit 119. In one embodiment, cell 203 is coupled to sense amplifier circuit 119 by asserting the appropriate word line and column (through column decode circuitry 117) (not shown in FIG. 2). Cell 203 is coupled to supply voltage VSS (system ground in some embodiments) by an access transistor (e.g. 112) (not shown in FIG. 2) being made conductive by an asserted word line.

In the embodiment shown, sense amplifier circuit 119 also uses a reference cell in reading a storage state of a memory cell. In one embodiment, cell 201 would represent the reference cell. In one embodiment, the reference cell is located in the same area of an integrated circuit as the array segment of the memory cell being read and is the same type of device. In one embodiment, the reference cell has a resistance value that is approximately equal distant from the typical resistance values of the memory cells having a low resistance storage state and the typical resistance values of the memory cells having a high resistance storage state. In other embodiments, reference cell may have a high resistance state value or a low resistance state value. In some embodiments, the typical resistance value of a memory cell in the low resistance state may be in the range of 1-5K ohms, the typical resistance value of a memory cell in the high resistance state may be in the range of 2-10K ohms, and the resistance value of the reference cell may be in the range of 1.5-7.5K ohms, depending upon the embodiment. However, other embodiments may utilize other resistive values.

In some embodiments, the reference cell is physically located with the rest of the sense amplifier circuit devices wherein the resistance between the memory cells of array 103 (including the decoder circuitry and access transistors) and the sense amplifier circuit 119 is reflected in the resistance value of the reference cell. In one embodiment, the reference cell may include multiple resistive elements. For example, the reference cell may include two legs in parallel with each leg including a high resistive cell element and a low resistive cell element in series. In some embodiments, different reference cells may be used during different memory read operations depending upon which memory cell is being read. In one embodiment, other devices (e.g. switches) may be located between sense amplifier circuit 119 and the reference cell. In other embodiments, cell 201 may represent the reference cell and cell 203 represents the memory cell being read. In still other embodiments, cells 201 and 203 are complementary memory cells.

Sense amplifier circuit 119 includes current path 211 and current path 209. Current path 211 includes P-channel transistor 207, node 215, and N-channel transistor 223, whose drain is connected to the drain of transistor 207 at node 215. Current path 209 includes P-channel transistor 205, node 217, and N-channel transistor 225, whose drain is connected to the drain of transistor 205 at node 217. The source of transistor 223 is connected to switches 233 and 235 that allow path 211 to be coupled to cell 201 or cell 203. The source of transistor 225 is connected to switches 237 and 239 that allow path 209 to be coupled to cell 201 or cell 203. Not shown in FIG. 2 is the column decode circuitry, access transistors, or other selection switches for coupling the cells to sense amplifier circuit 119. In one embodiment, switches 233, 235, 237, and 239 are located in sense amplifier circuit 119. However, in other embodiments, at least some of these switches may be located in other circuitry (e.g. decoder circuitry 117).

Sense amplifier circuit 119 includes a capacitor 227 having an electrode connected to the gate of transistor 223 and switch 219 and another electrode connected to the gate of transistor 225 and switch 221. Switch 219 is connected to node 215 and switch 221 is connected to node 217. During a first phase of a memory read operation, capacitor 227 stores a voltage differential between node 215 and node 217. During the second phase, that voltage differential is applied to the gate of transistor 223 with respect to the voltage applied to the gate of transistor 225 to further adjust the conductivity of transistor 223 versus transistor 225 during a second phase of a read operation. The adjustment between the gate voltages by the voltage differential stored on capacitor 227 further acts to increase the speed at which node 215 moves from its value in Phase 1 of a memory read operation to its value in Phase 2 of a memory read operation to reflect the storage state of the memory cell being read (either cell 203 or 201).

Sense amplifier circuit 119 includes switches 229 and 231 that are open during a memory read operation and are closed outside of a memory read operation to discharge capacitor 227. Switches 229 and 231 being closed also tie the gates of transistors 223 and 225 to VSS when sense amplifier circuit 119 is not being used to reduce parasitic current through paths 211 and 209 respectively.

In the embodiment shown, sense amplifier circuit 119 includes a capacitor 213 having an electrode coupled to a supply voltage VDD (e.g. 1 volt) and another electrode connected to the gates of transistors 207 and 205. The gates of transistors 207 and 205 are coupled to switch 241 which is coupled to a BIAS voltage source (e.g.600 mV below VDD). Switch 241 is closed between read operations to charge capacitor 213 and the gates of transistors 207 and 205 to the BIAS voltage.

Sense amplifier circuit 119 includes an output stage 243 that has an input coupled to output node 215. Stage 243 includes a NAND gate 249, an inverting amplifier 247, a capacitor 245, and a switch 251 connected to the input of NAND gate 249 and the input of inverting amplifier 247. NAND gate 249 includes a second input to receive an ENABLE signal indicating when the data at its output is valid. The output of NAND gate 249 provides the data signal. Although output stage 243 is shown in FIG. 2, other embodiments may include other types of output stages.

In one embodiment, capacitor 213 is implemented with a P-channel transistor whose source, drain, and body are connected to VDD and whose gate is connected to switch 241. Capacitor 227 is implemented with a metal to metal "fringe" capacitor or FMOM. However, these capacitors may be implemented by other types of capacitors in other embodiments.

In one embodiment, the switches (e.g. 219, 221, 229, 233) shown in FIG. 2 are implemented by transistors (e.g. N-channel transistors). In other embodiments, the switches may be implemented by other types of switching devices (e.g. pass gates, P-channel transistors other types of transistors).

Sense amplifier circuit 119 reads data from a memory cell in a two phase memory read operation. In FIG. 2, the switches are identified with the phases of a memory read operation in which they are closed. For example, switches 251, 219, 233 and 239 are identified with "PH1" indicating that they are closed during Phase 1 of a memory read operation and open during Phase 2 of a memory read operation. Switches 235 and 237 are identified with a "PH2" indicating that they are closed during Phase 2 of a memory read operation and open during Phase 1 of a memory read operation. Switch 221 is identified as "PH1 PH2" indicating that it is closed during both Phase 1 and Phase 2 of a memory read operation. Switches 241, 229 and 231 are identified as "*PH1 *PH2" indicating that the switches are open during Phase 1 and Phase 2 and are closed outside of Phase 1 and Phase 2. In one embodiment, Phase 1 is characterized as a pre-charge phase and Phase 2 is characterized as a sense phase of a memory read operation.

Figure 3:
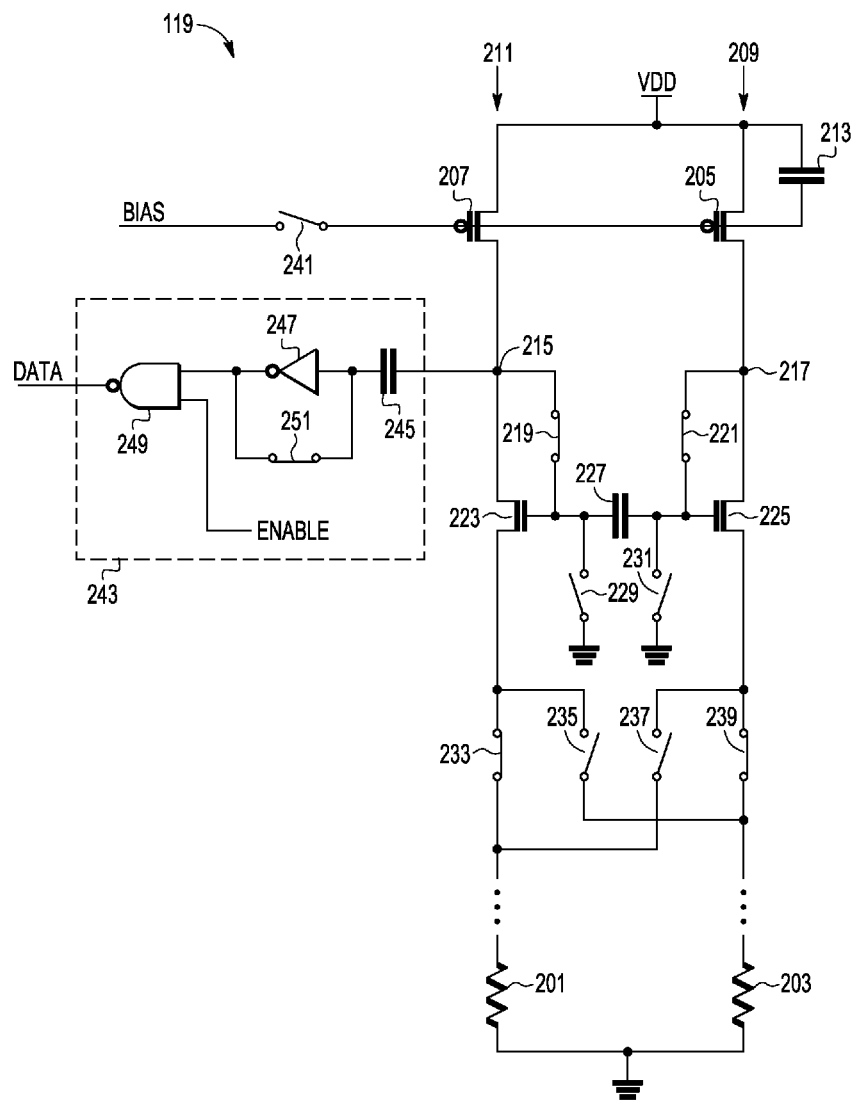
FIG. 3 is a circuit diagram of the sense amplifier circuit of FIG. 2 showing a phase of a memory read operation according to one embodiment of the present invention.

FIG. 3 shows a circuit diagram of sense amplifier circuit 119 during Phase 1 of a memory read operation. During Phase 1, switches 251, 219, 221, 233, and 239 are closed and the other switches shown in FIG. 3 are open.

During Phase 1, transistors 207 and 205 are biased by the sampled voltage stored on capacitor 213, which is approximately the same as the BIAS voltage, to provide a constant current through paths 211 and 209. Transistors 223 and 225 are in a diode configuration with switches 219 and 221 closed, wherein the $V_{DS}$ voltage drop across transistors 223 and 225 is a diode voltage drop. Switch 233 is closed to couple cell 201 to path 211 and switch 239 is closed to couple cell 203 to path 209.

As a result of Phase 1, the voltage at node 215 equals the current produced by transistor 207 times the resistance of cell 201 plus the diode drop of transistor 223. Also, the voltage at node 217 equals the current produced by transistor 205 times the resistance of cell 203 plus the diode drop of transistor 225. If cell 201 has a higher resistance than cell 203, then the voltage at node 215 will be higher than the voltage at node 217. If cell 201 has a lower resistance than cell 203, then node 215 will have a lower voltage than node 217. During this time, the difference in voltages between node 215 and 217 is sampled by capacitor 227.

During Phase 1, switch 251 is closed which ties the output of inverting amplifier 247 to its input. One electrode of capacitor 245 is charged to the voltage of node 215 and the other electrode of capacitor 245 is charged to the trip point of inverting amplifier 247.

Figure 4:
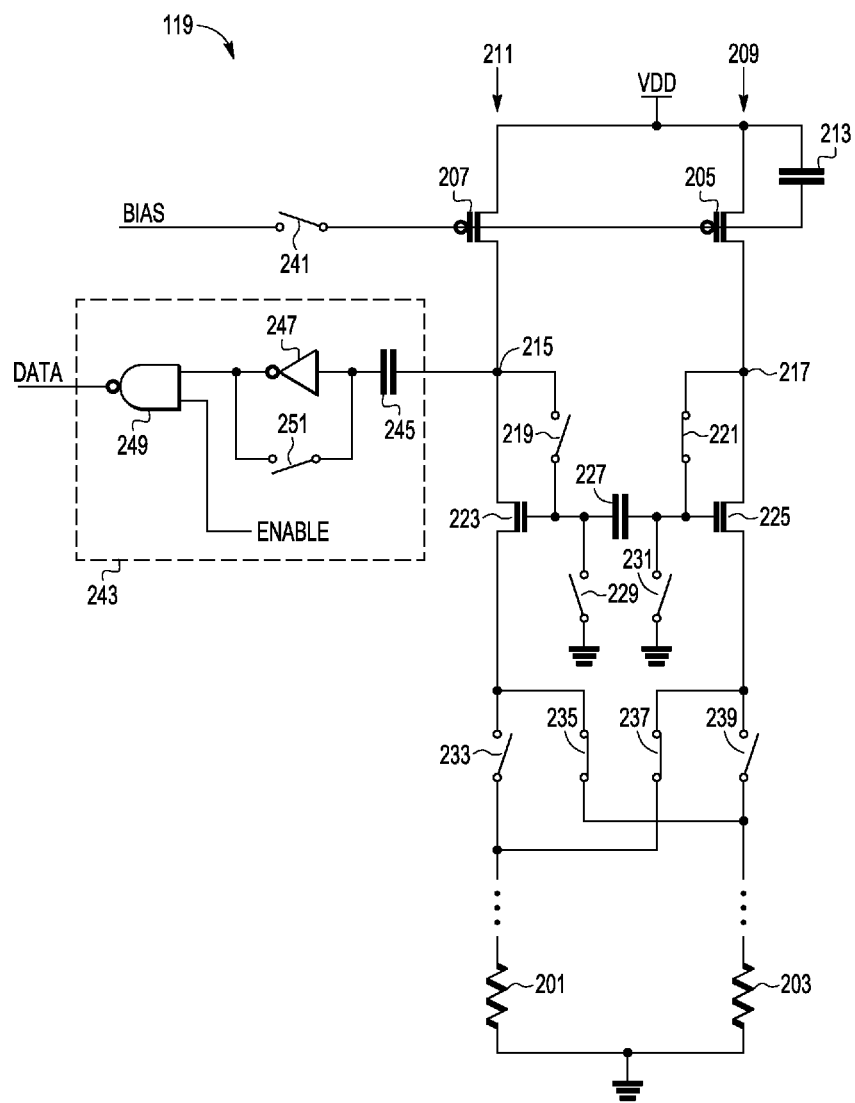
FIG. 4 is a circuit diagram of the sense amplifier circuit of FIG. 2 showing another phase of a memory read operation according to one embodiment of the present invention.

FIG. 4 shows a circuit diagram of sense amplifier circuit 119 during Phase 2 of a memory read operation. During Phase 2, switches 221, 235, and 237 are closed and the other switches shown in FIG. 4 are open.

With switch 241 open during Phase 2, the gates of transistors 207 and 205 continue to be biased by the sampled voltage stored on capacitor 213 to maintain the same current provided by current source transistors 207 and 205 during Phase 1. Isolating the gates of transistors 205 and 207 from the BIAS voltage source and biasing the gates with capacitor 213 in some embodiments, minimizes the effect of kickback noise on current paths 211 and 209 due to the other sense amplifier circuits of memory circuit 101 whose current source transistors (e.g. 207 and 205) are also biased by the BIAS voltage source. In some embodiments, switch 241 may be closed during Phase 1 if there is not enough time between read operations (during which time switch 241 is closed) to charge capacitor 213 to the BIAS voltage.

During Phase 2, switch 235 is closed to couple cell 203 to path 211 and switch 237 is closed to couple cell 201 to path 209. With switch 221 remaining closed during Phase 2, transistor 225 remains in a diode configuration. The voltage of node 217 is equal to the current through transistor 205 times the resistance of cell 201 plus the diode voltage drop of transistor 225. If the resistance of cell 201 is higher than the resistance of cell 203, then the voltage at node 217 will be higher in Phase 2 than in Phase 1. If the resistance of cell 201 is lower than the resistance of cell 203, then voltage of node 217 will be lower than in Phase 1.

The movement of the voltage of node 215 during Phase 2 is affected by the conductivity of transistor of 223 and the difference in IR drop between cell 201 and cell 203.

During Phase 2, switch 219 opens and transistor 223 is no longer in a diode configuration. Thus, its conductivity is no longer primarily controlled by the voltage of node 215. Accordingly, the conductivity of transistor 223 is controlled by the voltage of node 217 plus the voltage stored on capacitor 227. Because of the opening of switch 219 in Phase 2, capacitor 227 acts as a floating battery having a voltage that was sampled in Phase 1.

If during Phase 1, the voltage of node 215 ($V_{215}$) is higher than the voltage of node 217 ($V_{217}$) (due to the resistance of cell 201 being higher then cell 203), the voltage differential stored on capacitor 227 (referred to as an "additive voltage since $V_{215}>V_{217}$) is added to the voltage of node 217 during Phase 2 to control the conductivity of transistor 223. Because the voltage of node 217 goes up in Phase 2 (because the resistance of cell 201 is higher than cell 203) and because the voltage on capacitor 227 is additive, the conductivity of N-channel transistor 223 increases to a higher level and increases at a rate faster than if the gate of transistor 223 were coupled to node 215. The increase in conductivity acts to reduce the resistance of transistor 223 and increases the current sinking ability of transistor 223 which pulls down the voltage of node 215. In addition, with the resistance of cell 203 being less than cell 201, the cell voltage drop of path 211 is reduced (as compared to Phase 1), there by contributing to more conductivity of transistor 223 by reduced source voltage and contributing to the reduction in voltage of node 215.

If during Phase 1, the voltage of node 215 ($V_{215}$) is less than the voltage of node 217 ($V_{217}$) (due to the resistance of cell 201 being lower then cell 203), the voltage differential stored on capacitor 227 (referred to as a "subtractive" voltage since $V_{215}<V_{217}$) is subtracted from the voltage of node 217 during Phase 2 to control the conductivity of transistor 223. Because the voltage of node 217 goes down in Phase 2 (because the resistance of cell 203 is higher than cell 201) and because the voltage on capacitor 227 is subtractive, the conductivity of N-channel transistor 223 decreases to a lower level and decreases at a rate faster than if the gate of transistor 223 were coupled to node 215. The decrease in conductivity acts to increase the resistance of transistor 223 and decreases the current sinking ability of transistor 223 which pulls up the voltage of node 215. In addition, with the resistance of cell 201 being less than cell 203, the cell voltage drop of path 211 is increased (as compared to Phase 1) to reduce the conductivity of transistor 223 because it sees a higher source voltage, thereby contributing to the increase in voltage of node 215.

Figure 5:
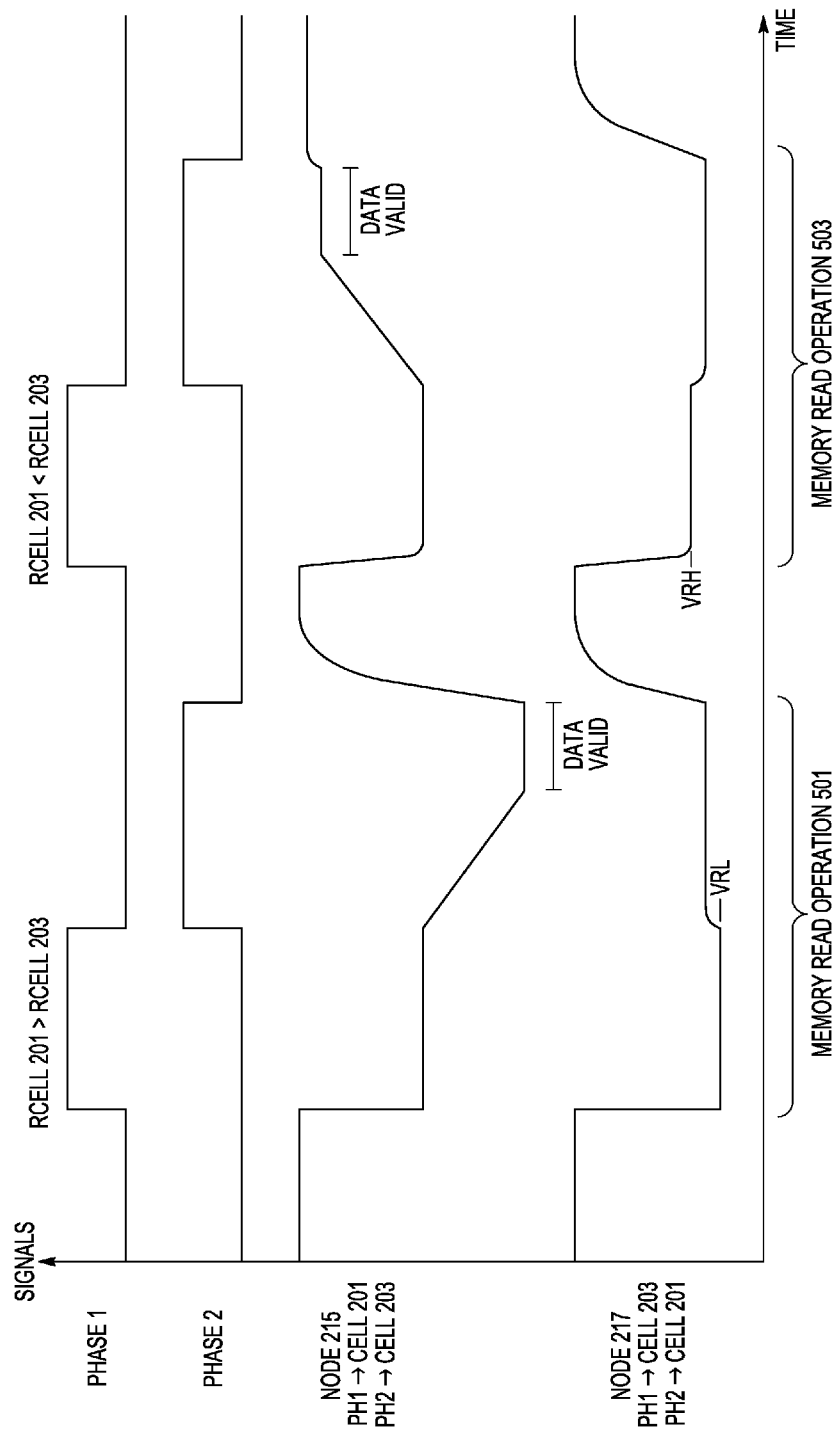
FIG. 5 is a timing diagram of a read operation of a memory cell according to one embodiment of the present invention.

FIG. 5 is a timing diagram of sense amplifier circuit 119 during two memory read operations (501 and 503). For memory read operation 501, the resistance of cell 201 is greater than the resistance of cell 203. For memory read operation 503, the resistance of cell 201 is less than the resistance of cell 203. In one embodiment where cell 201 is a reference cell, memory read operation 501 shows a read operation where cell 203 is a memory cell of segment 108 having a low resistance storage state and memory read operation 503 shows a read operation where cell 203 is a memory cell of segment 108 having a high resistance storage state.

In FIG. 5, the Phase 1 signal is at a high value during Phase 1 of a memory read operation and the Phase 2 signal is at a high value during Phase 2 of a memory read operation.

FIG. 5 also shows the voltages of nodes 215 and 217. During Phase 1 of memory read operation 501, the voltages at nodes 215 and 217 settle at constant values that are determined by the resistive values of cells 201 and 203. Because cell 201 is has a higher resistance value, voltage of node 215 will be higher than the voltage of node 217 (labeled as voltage VRL) e.g. by 10-20 mV. This difference in voltage is stored on capacitor 227 as an additive voltage.

In Phase 2 of memory read operation 501, the voltage of node 217 increases because cell 201 has a higher resistance than cell 203. The voltage on node 215 drops due to the higher voltage of node 217 and the additive voltage of capacitor 227 being applied to the gate of transistor 223, which is no longer in a diode configuration due the opening of switch 219 as well as a smaller source voltage on transistor 223. Accordingly the voltage of node 215 drops to a relatively low value to indicate that cell 203 has a low resistive storage state. Once node 215 drops below a threshold during Phase 2 (e.g. relative to the voltage of node 215 during Phase 1), the indication of the storage state at node 215 is considered valid. In one embodiment, the data valid portion of Phase 2 occurs at a specified period of time in the range of 2-10 nanoseconds after the beginning of Phase 2. However, the time difference between the beginning of Phase 2 and the beginning of the data valid portion may be different in different embodiments. It is during the data valid period that the ENABLE signal is asserted and the data value is passed through the output stage 243.

During Phase 1 of memory read operation 503, because cell 201 is a reference cell in the embodiment shown, the voltage at node 215 is the same as the voltage of node 215 during Phase 1 of the memory read operation 501. However, because cell 203 represents a cell with a high resistive state in memory read operation 503, the voltage of node 217 is at a higher voltage level VRH than the voltage level VRL of node 217 during Phase 1 of memory read operation 501. In one embodiment, the difference between VRL and VRH is in the range of 2-30 mV but maybe of another difference voltage in other embodiments. Because VRH is higher than the voltage of node 215, the voltage at the gate of transistor 223 is subtracted through capacitor 227.

In Phase 2 of memory read operation 503, the voltage of node 217 decrease because cell 201 has a lower resistance than cell 203. The voltage on node 215 increases due to the lower voltage of node 217 and the subtractive voltage of capacitor 227 being applied to the gate of transistor 223, which is no longer in a diode configuration due the opening of switch 219. Accordingly, the voltage of node 215 rises to a relatively high value (as compared to its voltage in Phase 1) to indicate that cell 203 has a high resistive storage state. Once node 215 rises above a threshold during Phase 2, the indication of the storage state at node 215 is considered valid.

As shown in FIG. 5, because transistor 223 is no longer diode connected in Phase 2, the voltage swing between the low voltage value of node 215 indicating that cell 203 is at a low resistive state (as in operation 501) and the high voltage value of node 215 indicating that cell 203 is at a high resistive state is much greater than the difference between voltages VRL and HRL of node 217. In one embodiment, the difference in final Phase 2 voltages of node 215 is in the range of 10 to 20 times the difference between voltages VRL and VRH.

Referring back to FIG. 2, between the memory read operations, switches 229 and 231 are closed and switches 219 and 221 open to discharge capacitor 227. In some embodiments, switch 221 maybe positioned such that it is also isolates the gate of transistors 225 (along with node 217) from capacitor 227 when open. Switch 241 is also closed between memory read operations to charge capacitor 213

Because the input of inverting amplifier 247 is coupled via switch 251 to the output of inverting amplifier 247 during Phase 1, when switch 251 is opened during Phase 2, the small change in voltage of node 215 is amplified by inverting amplifier 247 and reflected as the read data at the output of NAND gate 249.

Figure 6:
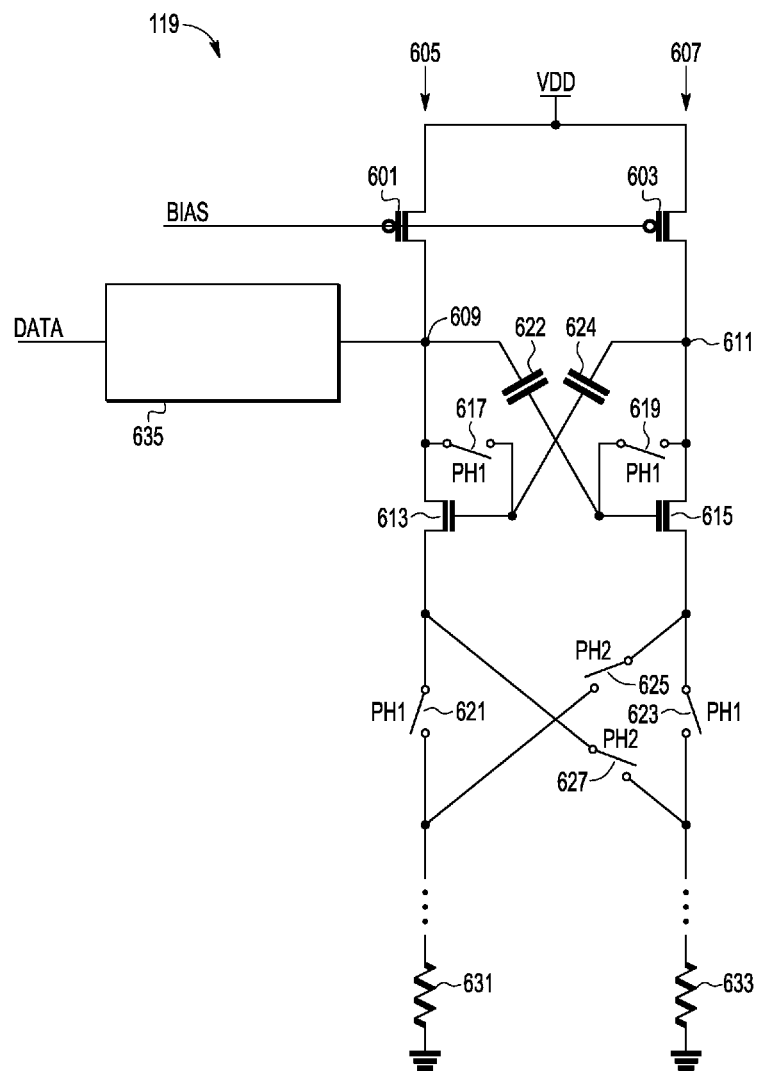
FIG. 6 is a circuit diagram of a sense amplifier circuit according to another embodiment of the presentation invention.

FIG. 6 is a circuit diagram of sense amplifier circuit 119 according to another embodiment according to the present invention. Sense amplifier circuit 119 includes two current paths 605 and 607. Current path 605 includes a P-channel transistor 601 configured a current source during a memory read operation and an N-channel transistor 613. Path 607 includes P-channel transistor 603 configured a current source during a memory read operation and an N-channel transistor 615. In the embodiment, shown, P-channel transistors 601 and 603 are biased by a BIAS voltage during both Phase 1 and Phase 2 for setting the amount of current through the paths, but could include a sampling capacitor similar to capacitor 213 in other embodiments.

Sense Amplifier circuit 119 of FIG. 6 is similar to sense amplifier circuit 119 of FIG. 2 in that it performs a two phase memory read operation. The switches shown in FIG. 6 with an indication of "PH1" are closed during Phase 1 and open during Phase 2. The switches with a designation of "PH2" are closed during Phase 2 and opened during Phase 1. The sense amplifier circuit of FIG. 6 also includes an output stage 635 that in one embodiment is similar to output stage 243.

Switch 621 couples path 605 to cell 631 during Phase 1 and switch 627 couples path 605 to cell 633 during Phase 2. Switch 623 couples path 607 to cell 633 during Phase 1 and switch 625 couples path 607 to cell 631 during Phase 2. Cell 631 is similar to cell 201 and cell 633 is similar to cell 203.

Sense amplifier circuit 119 of FIG. 6 is different than the sense amplifier circuit 119 of FIG. 2 in that it includes two capacitors 622 and 624 that store the voltage difference between nodes 609 and 611 during Phase 1 of a memory read operation. Whereas sense amplifier circuit 119 of FIG. 2 includes only one capacitor 227 for storing the voltage difference between nodes 215 and 217. During Phase 1, switches 617 and 619 are closed such that each of capacitor 622 and capacitor 624 includes one electrode coupled to node 609 and the other electrode coupled to node 611. Also during Phase 1, switches 617 and 619 are closed such transistors 613 and 615 are in a diode configuration.

During Phase 2, switches 617 and 619 open such that both transistor 613 and 615 are no longer in a diode configuration (as opposed to transistor 225 remaining in a diode configuration during Phase 2). With the opening of switch 617, the voltage of the gate of transistor 613 is controlled by the voltage of node 611 and the voltage of capacitor 624. With the opening of switch 619, the voltage of the gate of transistor 615 is controlled by the voltage of node 609 and the voltage of capacitor 622.

The electrode of capacitor 622 that was coupled in Phase 1 to node 611 through switch 619 is used to adjust the voltage of the gate of transistor 615 during Phase 2. The electrode of capacitor 624 that was coupled in Phase 1 to node 609 through switch 617 is used to adjust the voltage of the gate of transistor 613 during Phase 2. Because a different node side electrode of each of capacitor 622 and capacitor 624 is applied to the gate of transistor 613 and the gate of transistor 615, the voltage stored by one of capacitor 622 and capacitor 624 will be additive by a value and the other will be subtractive by the same value during a memory read operation. For example, if node 609 is 100 mV higher than node 611 during Phase 1, then capacitor 622 will reduce the voltage of node 609 by 100 mV at the gate of transistor 615 and capacitor 624 will increase the voltage of node 611 by 100 mV at the gate of transistor 613 during Phase 2. Which capacitor supplies the subtractive voltage and which capacitor supplies the additive voltage will depend on which one of cell 631 or cell 633 has the higher resistance value during a memory read operation.

Because in the embodiment of FIG. 6 transistor 615 is not diode connected during Phase 2 (unlike transistor 225 in the embodiment of FIG. 2), the voltage of node 611 changes by a wider margin during Phase 2 of a memory read operation than node 217. Referring to FIG. 5, assume that node 609 corresponds to node 215 and node 611 corresponds to node 217. Instead of rising slightly in Phase 2 of memory read operation 501 as shown for node 217, the voltage of node 611 would rise to a much higher value. For example, the voltage would rise to the voltage shown for node 215 during the data valid portion of Phase 2 of memory read operation 503. In Phase 2 of memory operation 503, the voltage of node 611 would fall to a lower voltage value than that shown in FIG. 5 for node 217. For example, the voltage would fall to the voltage shown for node 215 during the data valid portion of Phase 2 of memory read operation 501. In one embodiment, either node 609 or node 611 can serve as an output node to an output stage wherein the voltage values provided at each of nodes 609 and 611 are complimentary.

Not shown in the embodiment of FIG. 6 are switches used to discharge capacitors 622 and 624 between memory read operations (e.g. similar to switches 229 and 231 of FIG. 2). In one embodiment, an isolation switches (not shown) would be located in path 605 between transistor 601 and node 609 and between transistor 603 and node 611. The circuit would include a switch to couple node 609 to ground and a switch to coupled node 611 to ground for discharging the capacitors.

In one embodiment, the sense amplifier circuit of FIG. 2 is simpler in that it includes one less capacitor and at least two less isolations switches. Accordingly, there may be advantageously less capacitive loading on nodes 215 and 217 than with nodes 609 and 611 of the embodiment of FIG. 6. However, in some embodiments of the sense amplifier circuit of FIG. 6, there may be a more dynamic swing between output nodes 609 and 611 because of the regenerative feedback than between nodes 215 and 217 of the sense amplifier circuit of FIG. 2.

Using a capacitor to store a difference in voltage between two current paths during one phase of a memory read operation and then using the capacitor in controlling the output voltage during a second phase of a memory read operation not only speeds up the memory read operation but it also allows for the sense amplifier circuit to account for mismatches between devices of the two paths.

In some embodiments, utilizing N-channel transistors for transistors 223 and 225 and for transistors 613 and 615 may advantageously provide the sense amplifier circuit with a higher voltage gain due to the higher mobility of N-channel transistors versus P-channel transistors for a fixed area. However in other embodiments, the conductivity of the transistors may be switched.

Providing a sense amplifier circuit with current sources in the current paths acts to reduce the current through the paths to reduce read disturb in the memory cells during a memory read operation, especially in resistive memory cells. In some embodiments, a transistor is configured as a current source when it provides a relatively the same current independent of the voltage across its current terminals such as when a MOSFET is in saturation. In some embodiments, transistors 205 and 207 and transistors and transistors 601 and 603 may not be in saturation during an initial portion of Phase 1 of a memory read operation or during a latter portion of Phase 2 of a memory read operation such as during a data valid portion.

In other embodiments, sense amplifier circuit 119 can be used to read complimentary memory cells where the complimentary memory cells are programmed at complementary storage states to store a data value. For example, with resistive complementary memory cells, a first complementary memory cell of a pair of complementary memory cells would be programmed to have a high resistive state and the second complementary cell of the pair would be programmed to have a low resistive state in order to store a specific data value (e.g. a "1" or "0"). To store the opposite data value, the first complementary memory cell would be programmed to have a low resistive state and the second complementary memory cell would be programmed to have a high resistive state. In the embodiments of the Figures, cells 201 and 203 and cells 631 and 633 would be complementary memory cells, each programmed with the opposite resistive state to store a data value.

Although the sense amplifier circuits shown are implemented with MOSFETS, a sense amplifier circuit can be implemented with other devices, e.g. bipolar transistors, in other embodiments. In addition, some embodiments of a memory read operation may include an additional phase in addition to Phase 1 and Phase 2. Also, features described herein with respect to one embodiment, may be implemented in other embodiments described herein.

In one embodiment, a sense amplifier circuit includes a first transistor and a second transistor. The first transistor is configured as a current source for a first current path during at least a latter portion of a first phase of a memory read operation and during at least an initial portion of a second phase of a memory read operation. The second transistor is configured as a current source for a second current path during at least a latter portion of a first phase a memory read operation and during at least an initial portion of a second phase of a memory read operation. The sense amplifier circuit includes a third transistor located in the first current path, a fourth transistor located in the second current path, and a capacitor having a first electrode and a second electrode. During a first phase of a memory read operation, the first electrode is coupled to a node of the first current path and the second electrode is coupled to a node of the second current path. During a second phase of a memory read operation, the first electrode is coupled to a control terminal of the third transistor and the second electrode is coupled to the node of the second current path. During a first phase of a memory read operation, the first current path is coupled to a first cell via a first switch in a closed position and the second current path is coupled to a second cell via a second switch in a closed position. During a first phase of a memory read operation, a third switch and a fourth switch are open. During a second phase of a memory read operation, the first current path is coupled the second cell via the third switch in a closed potion and the second current path is coupled to the first cell via the fourth switch in a closed position. During a second phase of a memory read operation, the first switch and the second switch are open.

In another embodiment, a method of reading a memory cell includes performing a first phase of a memory read operation. During the first phase, a first electrode of a capacitor is coupled a first node of a first current path and a second electrode of the capacitor is coupled to a second node of a second current path. During the first phase, the capacitor samples a voltage difference between the first node and the second node. The first current path includes a first transistor configured as a current source for at least a latter portion of the first phase. The second current path includes a second transistor configured as a current source for at least a latter portion of the first phase. The first current path includes a third transistor, and the second current path including a fourth transistor. The first node is located in the first current path between the first transistor and the third transistor, and the second node is located in the second current path between the second transistor and the fourth transistor. During the first phase, the first current path is coupled to a first cell via a first switch in a closed position and the second current path is coupled to a second cell via a second switch in a closed position. During the first phase, a third switch and a fourth switch are open. The method further includes performing a second phase of the memory read operation. During the second phase, the first electrode is coupled to a control terminal of the third transistor and the second electrode is coupled to the second node. The first current path is coupled the second cell via the third switch in a closed potion and the second current path is coupled to the first cell via the fourth switch in a closed position. During the second phase, the first switch and the second switch are open. The first transistor is configured as a current source for at least an initial portion of the second phase, and the second transistor is configured as a current source for at least an initial portion of the second phase.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A sense amplifier circuit comprising:
   a first transistor and a second transistor, the first transistor configured as a current source for a first current path during at least a latter portion of a first phase of a memory read operation and during at least an initial portion of a second phase of a memory read operation and the second transistor configured as a current source for a second current path during at least a latter portion of a first phase a memory read operation and during at least an initial portion of a second phase of a memory read operation;
   a third transistor located in the first current path;
   a fourth transistor located in the second current path;
   a capacitor having a first electrode and a second electrode, during a first phase of a memory read operation, the first electrode is coupled to a node of the first current path and the second electrode is coupled to a node of the second current path, wherein during a second phase of a memory read operation, the first electrode is coupled to a control terminal of the third transistor and the second electrode is coupled to the node of the second current path;
   wherein during a first phase of a memory read operation, the first current path is coupled to a first cell via a first switch in a closed position and the second current path is coupled to a second cell via a second switch in a closed position, during a first phase of a memory read operation, a third switch and a fourth switch are open, wherein during a second phase of a memory read operation, the first current path is coupled the second cell via the third switch in a closed potion and the second current path is coupled to the first cell via the fourth switch in a closed position, during a second phase of a memory read operation, the first switch and the second switch are open.

2. The sense amplifier circuit of claim 1 wherein the third transistor and the fourth transistor are each characterized as N-channel transistors.

3. The sense amplifier circuit of claim 2 wherein the first transistor and the second transistor are each characterized as P-channel transistors.

4. The sense amplifier circuit of claim 1 wherein during a first phase of a memory read operation, the first electrode is coupled to a control terminal of the third transistor and the second electrode is coupled to a control terminal of the fourth transistor.

5. The sense amplifier circuit of claim 1 wherein the node of the first current path is located between the first transistor and the third transistor and the node of the second current path is located between the second transistor and the fourth transistor.

6. The sense amplifier circuit of claim 1 wherein during a second phase of a memory read operation, the second electrode is coupled to the control terminal of the fourth transistor.

7. The sense amplifier circuit of claim 1 wherein during a first phase of a memory read operation, the first electrode is coupled to a first current terminal of the third transistor via a fifth switch in a closed position, wherein during a second phase of a memory read operation, the first switch is open.

8. The sense amplifier circuit of claim 7, wherein during a first phase of a memory read operation and during a second phase of a memory read operation, the second electrode is coupled to the control terminal and a first current terminal of the fourth transistor.

9. The sense amplifier circuit of claim 7 wherein during a first phase of a memory read operation, the second electrode of the capacitor is coupled to a control terminal of the fourth transistor via a second switch in a closed position, wherein during the second phase, the second switch is open.

10. The sense amplifier circuit of claim 7 further comprising a second capacitor including a first electrode and a second electrode, wherein during a first phase of a memory read operation, the first electrode of the second capacitor is coupled to a first current terminal of the fourth transistor via a sixth switch in a closed position and the second current electrode is coupled to the first current terminal of the third transistor, wherein during a second phase of a memory read operation, the sixth switch is open.

11. The sense amplifier circuit of claim 1 further comprising:
    a second capacitor having a first electrode coupled to the control terminal of the first transistor and the control terminal of the second transistor, wherein during a second phase of a memory read operation, a voltage on the second capacitor biases a control terminal of the first transistor to control an amount of current through the first current path and biases a control terminal of the second transistor to control an amount of current through the second current path.

12. A memory circuit comprising the sense amplifier circuit of claim 1 and further comprising:
an array of memory cells, the sense amplifier circuit is couplable to the array to determine a storage state of a memory cell of a set of at least one memory cell of the array.

13. The memory circuit of claim 12 wherein the array of memory cells is characterized as an array of resistive memory cells.

14. The sense amplifier circuit of claim 1 wherein one of the first cell and the second cell is characterized as a reference cell and the other of the first cell and the second cell is characterized as a memory cell being read during a memory read operation.

15. The sense amplifier circuit of claim 1 wherein the first cell and the second cell are characterized as a pair of complimentary memory cells with each cell of the first cell and the second cell being programmable at a complementary storage state to store a value that is read during a memory read operation.

16. A method of reading a memory cell comprising:
performing a first phase of a memory read operation, during the first phase, a first electrode of a capacitor is coupled a first node of a first current path and a second electrode of the capacitor is coupled to a second node of a second current path, during the first phase, the capacitor samples a voltage difference between the first node and the second node, the first current path includes a first transistor configured as a current source for at least a latter portion of the first phase, the second current path including a second transistor configured as a current source for at least a latter portion of the first phase, the first current path includes a third transistor, the second current path including a fourth transistor, the first node is located in the first current path between the first transistor and the third transistor, the second node is located in the second current path between the second transistor and the fourth transistor, during the first phase, the first current path is coupled to a first cell via a first switch in a closed position and the second current path is coupled to a second cell via a second switch in a closed position, during the first phase, a third switch and a fourth switch are open;
performing a second phase of the memory read operation, during the second phase, the first electrode is coupled to a control terminal of the third transistor and the second electrode is coupled to the second node, the first current path is coupled the second cell via the third switch in a closed potion and the second current path is coupled to the first cell via the fourth switch in a closed position, during the second phase, the first switch and the second switch are open, the first transistor is configured as a current source for at least an initial portion of the second phase, the second transistor is configured as a current source for at least an initial portion of the second phase.

17. The method of claim 16 wherein during the first phase, the first electrode is coupled to the control terminal of the third transistor and the second electrode is coupled to a control terminal of the fourth transistor.

18. The method of claim 16 wherein during the first phase, the second electrode is coupled to a control terminal of the fourth transistor via a fifth switch, wherein during the second phase, the fifth switch is open.

19. The method of claim 16 wherein during the first phase, the first electrode is coupled to the first node via a fifth switch, wherein during the second phase, the fifth switch is open.

20. The method of claim 16 wherein during the second phase, the first electrode is coupled to the control terminal of the third transistor and the second electrode is coupled to a control terminal of the fourth transistor.

21. The method of claim 16 wherein:
during the first phase, a first electrode of a second capacitor is coupled to the first node of the first current path and a second electrode of the second capacitor is coupled to the second node of the second current path, during the first phase, the second capacitor samples a voltage difference between the first node and the second node;
during the second phase, the second electrode of the second capacitor is coupled to a control terminal of the fourth transistor and the first electrode of the second capacitor is coupled to the first node.

22. The method of claim 16 wherein the third transistor and the fourth transistor are each characterized as N-channel transistors and the first transistor and the second transistor are each characterized as P-channel transistors.

23. The method of claim 16, wherein during the second phase, control terminals of the first transistor and the second transistor are biased by a second capacitor, wherein the second capacitor is charged by a bias voltage source after the memory read operation.

\* \* \* \* \*